(12) United States Patent
Wang et al.

(10) Patent No.: US 8,704,252 B2
(45) Date of Patent: Apr. 22, 2014

(54) LIGHT EMITTING DEVICE

(75) Inventors: Chun-Kai Wang, Hsinchu (TW); Schang-Jing Hon, Hsinchu (TW); Yu-Pin Hsu, Hsinchu (TW); Jui-Yi Chu, Hsinchu (TW); Hsin-Hsien Wu, Hsinchu (TW); Wei-Yu Yen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 246 days.

(21) Appl. No.: 12/603,929

(22) Filed: Oct. 22, 2009

(65) Prior Publication Data

US 2010/0102295 A1    Apr. 29, 2010

(30) Foreign Application Priority Data

Oct. 23, 2008 (TW) ............................... 97140788 A
Nov. 6, 2008 (CN) ........................... 2008 1 0171059

(51) Int. Cl.
*H01L 33/00* (2010.01)

(52) U.S. Cl.
USPC ........................ 257/97; 257/13; 257/E33.03

(58) Field of Classification Search
USPC ....................................... 257/13, 97, E33.03
See application file for complete search history.

(56) References Cited

U.S. PATENT DOCUMENTS

| 2003/0214989 A1* | 11/2003 | Takase ............................ 372/45 |
| 2006/0027814 A1* | 2/2006 | Watanabe et al. ............... 257/79 |
| 2006/0131604 A1 | 6/2006 | Kozaki |
| 2009/0050875 A1* | 2/2009 | Kim et al. ........................ 257/13 |
| 2009/0283746 A1* | 11/2009 | Chua et al. ....................... 257/13 |

FOREIGN PATENT DOCUMENTS

| CN | 1459900 A | 12/2003 |
| EP | 1 248 303 A1 | 10/2002 |
| EP | 1 453 160 A1 | 9/2004 |

* cited by examiner

*Primary Examiner* — Zandra Smith
*Assistant Examiner* — Jamie C Niesz
(74) *Attorney, Agent, or Firm* — Muncy, Geissler, Olds & Lowe, P.C.

(57) ABSTRACT

This invention discloses a light-emitting device comprising a semiconductor stack layer having an active layer of a multiple quantum well (MQW) structure comprising alternate stack layers of quantum well layers and barrier layers, wherein the barrier layers comprise at least one doped barrier layer and one undoped barrier layer. The doped barrier layer can improve the carrier mobility of the electron holes and increase the light-emitting area and the internal quantum efficiency of the active layer.

11 Claims, 5 Drawing Sheets

LIGHT EMITTING DEVICE

TECHNICAL FIELD

The present application relates to a light emitting device structure, and more particularly to a light emitting device at least having a doped barrier layer and an un-doped barrier layer in its active layer.

BACKGROUND

Light emitting diode (LED) is an opto-electronic element that has been widely adopted in the field of light source. Comparing with traditional light bulb or fluorescent Lamp, LED shows significant improvement in power saving and lifetime. Therefore, LED devices gradually replace traditional light source in many application such as traffic sign, backlight module, lamp post or medical equipment.

FIG. 1A is a diagram illustrating a conventional light emitting diode structure. As shown in FIG. 1, a conventional LED includes a substrate 10, a semiconductor stack layer 12 disposed on the substrate 10 and an electrode 14 disposed on the semiconductor stack layer 12, wherein the semiconductor stack layer 12, from top to bottom, includes at least a p type semiconductor layer 120, an active layer 122 and a n type semiconductor layer 124. In addition, in the conventional LED 10, the active layer 122 is a multiple quantum well (MQW) structure. It means the active layer 122 is composed of a plurality of quantum well layers 126 and a plurality of barrier layers 128 which stack with each other.

The light emitting mechanism of the LED 100 is, by injection of electrons and holes respectively from the n type semiconductor layer 124 and the p type semiconductor layer into the active layer 122, to recombine electrons e and holes h in the quantum well layers 126 of the active layer 122 and release energy by emitting photons thereafter. FIG. 1B is a diagram illustrating bandgap and light emitting mechanism in a conventional LED. As shown in FIG. 1B, since the carrier mobility of holes h is lower than the carrier mobility of electrons e, most of the recombination of electrons e and holes h in LED 100 happens in a portion of the quantum well layers 126 near the p type semiconductor layer 120. Therefore, the light emitting region in active layer 122 concentrates in only a few of the quantum well layers 126 close to the p type semiconductor layer 120, so as to only a few of the structure in the active layer 122 emits light.

SUMMARY

The present application is to provide a light emitting device, comprising a semiconductor stack layer, wherein the semiconductor stack layer further comprises an active layer and the active layer further comprises a plurality of quantum well layers and a plurality of barrier layers mutually stacking with each other, wherein the barrier layer comprises a doped barrier layer and an undoped barrier layer.

In accordance with the present application, a light emitting device with a multiple quantum well structure is provided, wherein the multiple quantum well structure comprises barrier layers selectively doped with p-type impurity to increase the carrier mobility of holes.

In accordance with the present application, the carrier mobility of holes is increased by the multiple quantum well structure having barrier layers selectively doped with p-type impurity, so as to make holes distributing in the active layer more evenly to increase the light emitting region of the multiple quantum well structure and raise the internal quantum efficiency in LED.

Other features and advantages of the present application and variations thereof will become apparent from the following description, drawing and claims.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1A:
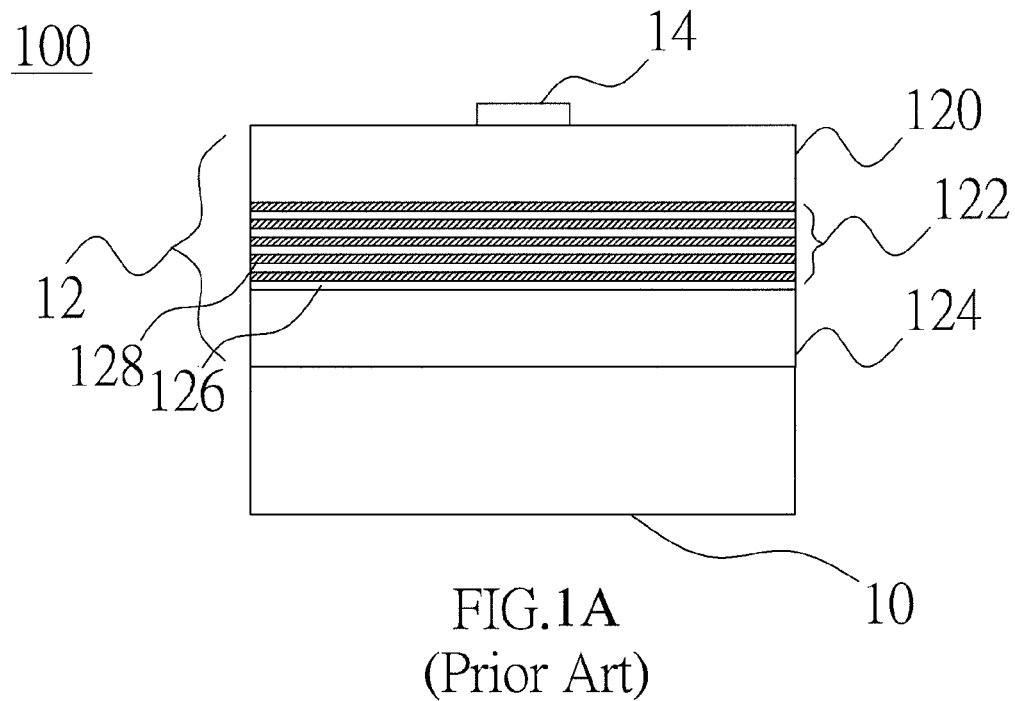
FIG. 1A is a diagram illustrating a conventional light emitting diode structure.
Figure 1B:
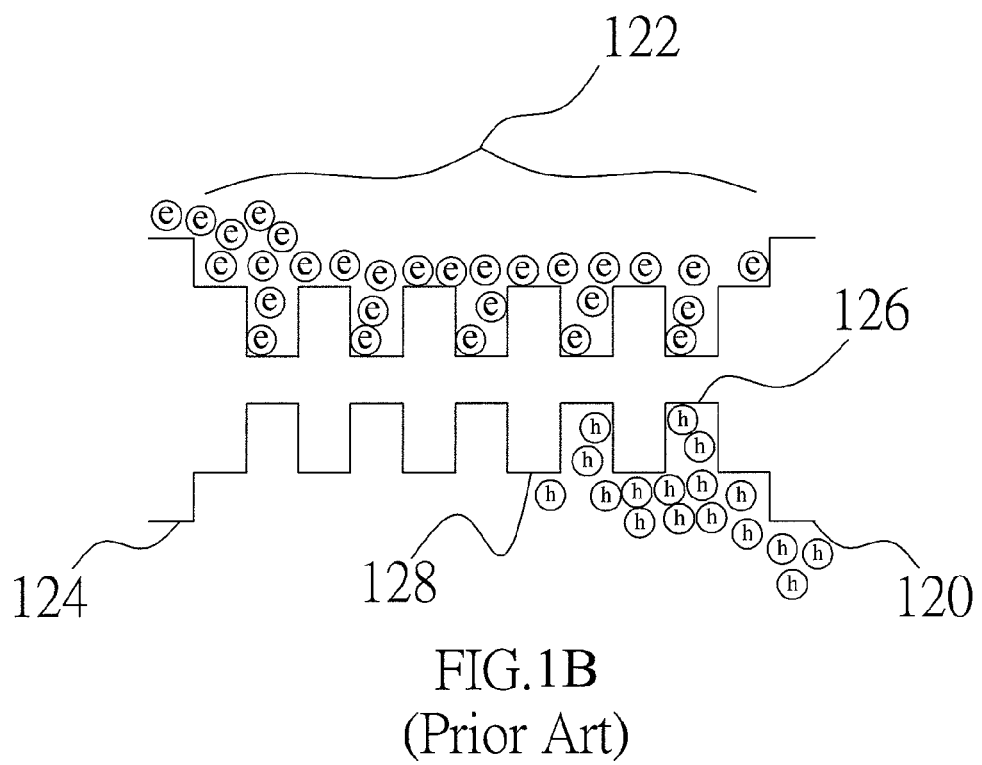
FIG. 1B is a diagram illustrating bandgap and light emitting mechanism in a conventional LED.
Figure 2:
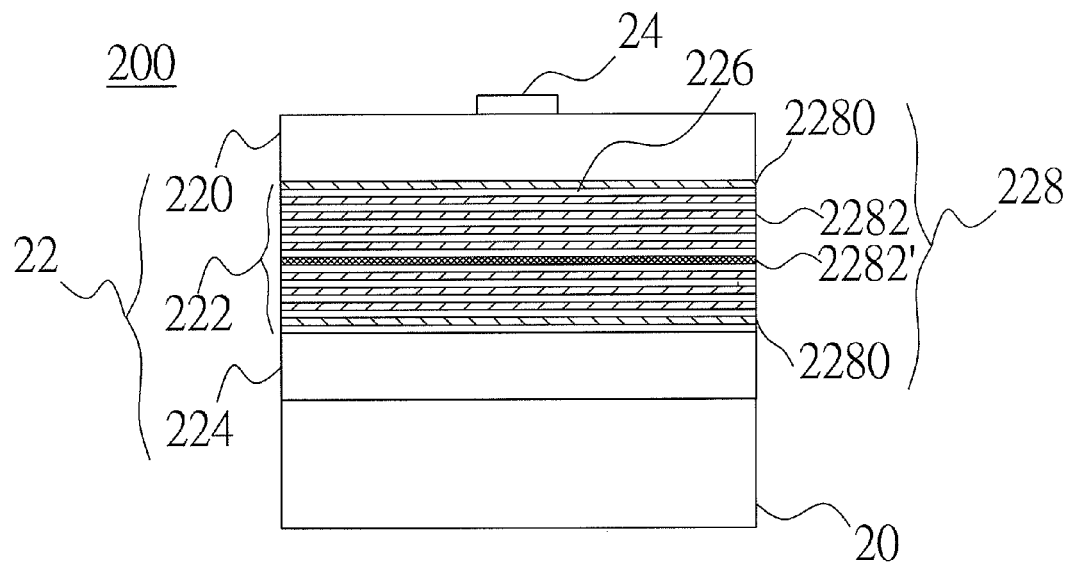
FIG. 2 is the schematic structure diagram in accordance with one embodiment of the present application.
Figure 3:
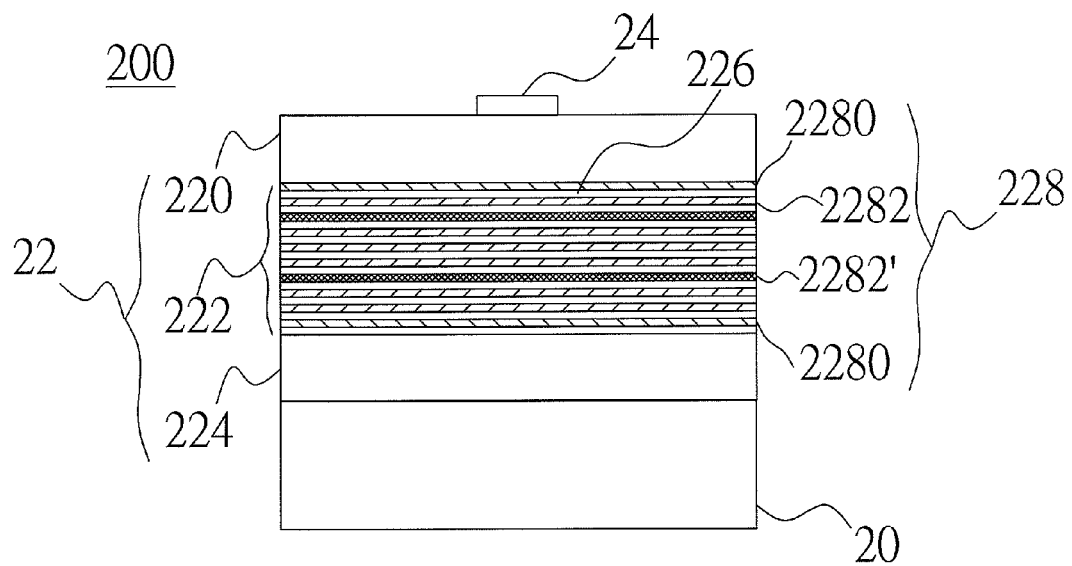
FIG. 3 is the schematic structure diagram in accordance with one embodiment of the present application.

The accompanying drawings incorporated herein provide a further understanding of the invention therefore constitute a part of this specification. The drawings illustrating embodiments of the invention, together with the description, serve to explain the principles of the invention FIG. 2 and FIG. 3 are the structure diagrams in accordance with one embodiment of the present application. As shown in FIG. 2, the light emitting device comprises a substrate 20, a semiconductor stack layer 22 disposed on the substrate 20 and at least one electrode 24 disposed on the semiconductor stack layer 22, wherein the substrate 20 can be an insulating substrate, a conductive substrate, a transparent substrate, or a light-absorbing substrate with material including metal, ZnO, SiC, Sapphire, Silicon, GaAs or GaP. The material of the semiconductor stack layer 22 can be III-V semiconductor materials comprising Al, Ga, In, P, As, or N, such as GaN, AlGaInP, or GaAs. For explaining the principles of the present application only, the substrate 20 is embodied by a ZnO conductive transparent substrate and the semiconductor stack layer is embodied by GaN materials in this embodiment.

The semiconductor stack layer 22, from top to bottom, comprises a first type conductivity semiconductor layer 220, an active layer 222 and a second type conductivity semiconductor layer 224, wherein the active layer 222 is a multiple quantum well structure comprising a plurality of quantum well layers 226 and a plurality of barrier layers 228, and the quantum well layers 226 and the barrier layers 228 are adjacent and mutually stack to each other. In this embodiment, the materials of the quantum well layers 226 are InGaN and the materials of the barrier layers 228 are GaN.

The barrier layers 228 comprise outer barrier layers 2280 and inner barrier layers 2282, wherein the outer barrier layers 2280 are the barrier layers 228 most close to the first type conductivity semiconductor layer 220 and the second type conductivity semiconductor layer 224. One or several layers of the inner barrier layers 2282 are randomly chosen to be doped with an impurity wherein the impurity is a p-type impurity such as Be, Mg, Ba, or C. In other words, in this embodiment, the inner barrier layers 2282 comprise a p-type doped barrier layer 2282' with p-type impurity, and the outer barrier layers 2280 are undoped layers.

As shown in FIG. 2, in this embodiment, the active layer 222 is embodied by a structure constructed from 10 pairs of the barrier layer 228 and the quantum well layer 226 wherein the barrier layer 228 and the quantum well layer 226 are stacked alternately. For abovementioned barrier layers 228, the inner barrier layers 2282 disposed in the middle of the active layer 222 is selected to be doped with impurity. In other words, the fifth barrier layer counting from the side close to the first conductivity semiconductor layer 220 is selected to be doped with impurity for forming the p-type doped barrier layers 2282'.

In addition, another embodiment is shown in FIG. 3, wherein the third layer and the seventh layer of the barrier layers 228 counting from the side close to the first conductivity semiconductor layer 220 are selected to be doped with impurity for forming p-type doped barrier layer 2282' so as to distribute the p-type doped barrier layers 2282' in the active layer 222 evenly.

Figure 4:
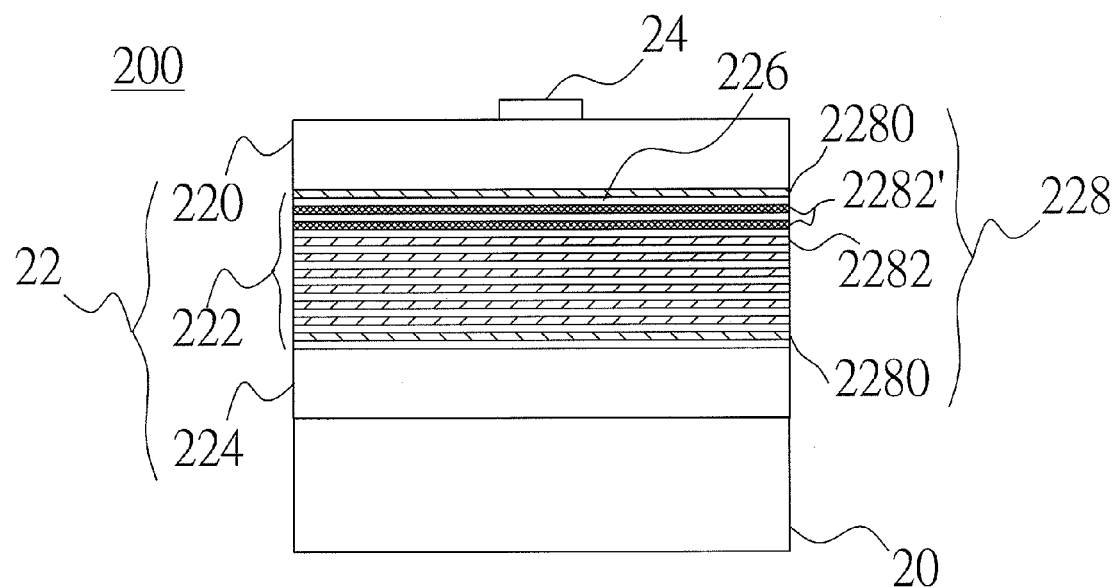
FIG. 4 is the schematic structure diagram in accordance with one embodiment of the present application.
Figure 5:
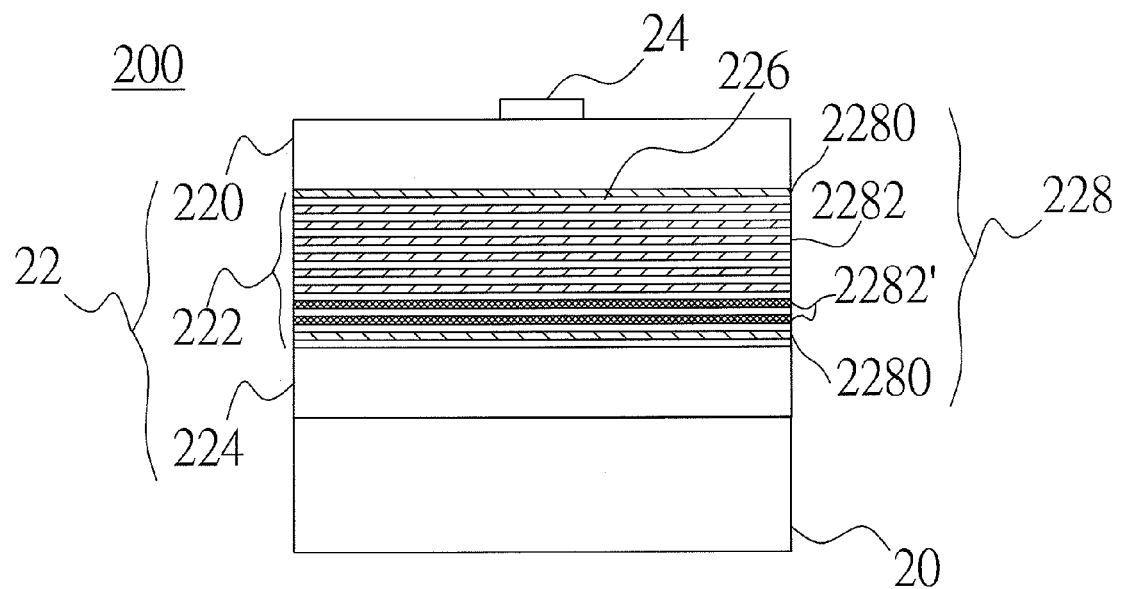
FIG. 5 is the schematic structure diagram in accordance with one embodiment of the present application.

Except disposed the p-type doped barrier layers 2282' in the middle of the active layer 222 or distributed the p-type doped barrier layers 2282' evenly in the active layer 222 as shown in FIG. 2 or FIG. 3, the p-type doped barrier layers 2282' are distributed in the active layer 222 unevenly as shown in FIG. 4 or FIG. 5 as well in some embodiments. As shown in FIG. 4, a region of the inner barrier layers 2282 close to the first conductivity semiconductor layer 220 is selected for being doped with p-type impurity, so as to form the p-type doped barrier layers 2282' near the region close to the first conductivity layer 220. In addition, as shown in FIG. 5, a region of the inner barrier layer 2282 close to the second conductivity semiconductor layer 224 is selected for being doped with p-type impurity, so as to form the p-type doped barrier layers 2282' near the region close to the second conductivity layer 224.

Figure 6:
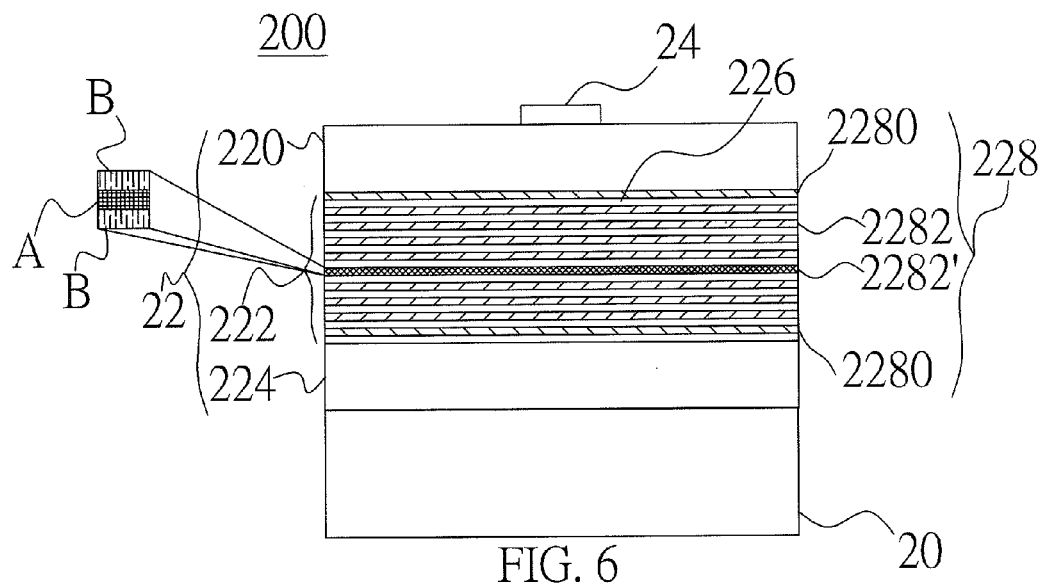
FIG. 6 is the schematic structure diagram in accordance with one embodiment of the present application.
Figure 7:
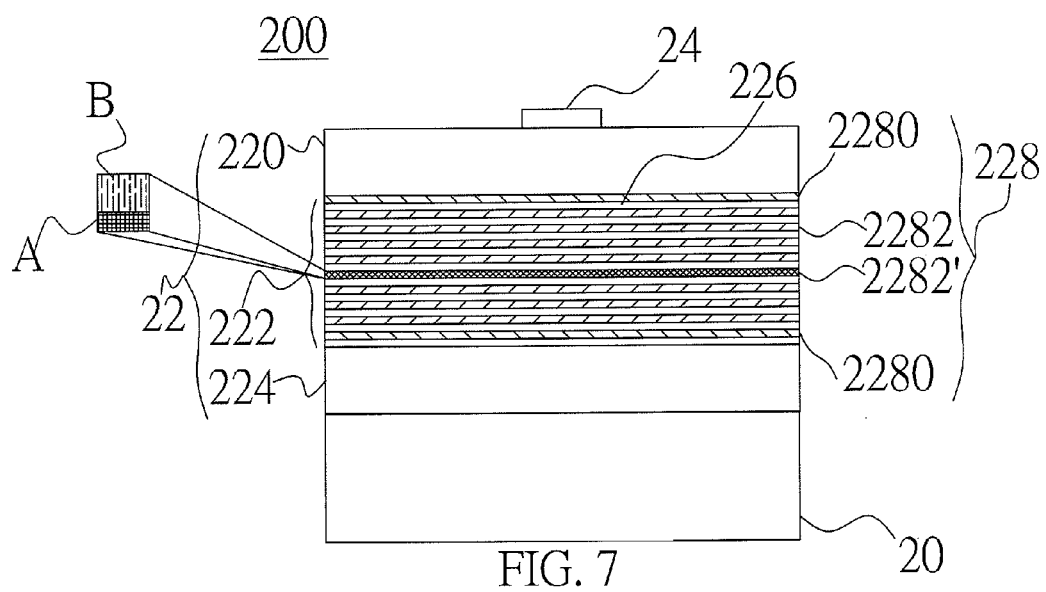
FIG. 7 is the schematic structure diagram in accordance with one embodiment of the present application.

Moreover, in some embodiments, the doping profile can concentrate on at least one specific region of p-type doped barriers 2282'. FIG. 6 and FIG. 7 are structure diagrams illustrating another embodiment. As shown in FIG. 6, the p-type doped barrier layers 2282' are doped with impurity through Delta doping (δ doping) method, so as to form a sandwich structure which comprises a doped area A and an undoped area B in the p-type doped barrier layers 2282'. In the sandwich structure, the doped area A is disposed between the undoped area B. In other words, the undoped area B wraps the doped area A up in the sandwich structure. As shown in FIG. 7, the doped area A is disposed in the area of p-type doped barrier layers 2282' which close to the adjacent quantum well area.

Figure 8:
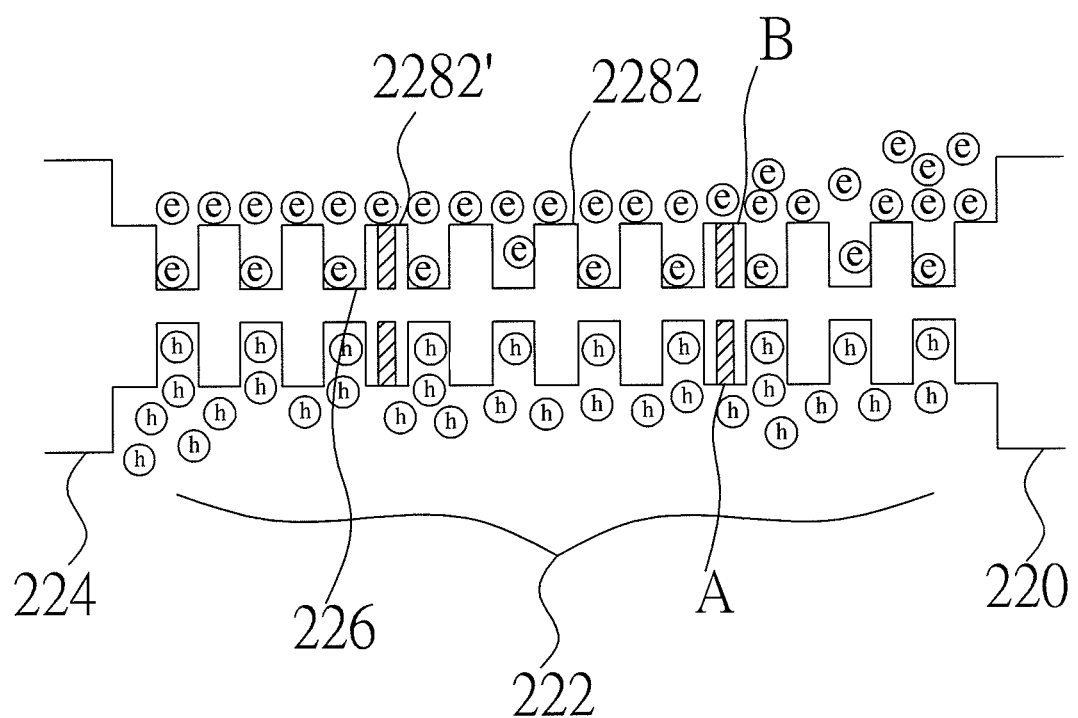
FIG. 8 is a bandgap diagram in accordance with the present application.

FIG. 8 is a bandgap diagram in accordance with the present application. As shown in FIG. 8, the p-type doped barrier layers 2282' raise the carrier mobility of the holes h, increase more injection quantity of holes h so that the holes h can be distributed in the active layer 222 more evenly. Therefore, the area in which electrons e and holes h recombine would distribute more evenly in active layer 222.

The light emitting device disclosed by the present application would raise the probability of internal quantum recombination, so as to increase the internal quantum efficiency and the brightness of the light emitting device.

Other embodiments of the application will be apparent to those having ordinary skills in the art from consideration of the specification and practice of the invention disclosed herein. It is intended that the specification and examples be considered as exemplary only, with a true scope and spirit of the invention being indicated by the following claims.

We claim:

1. A light emitting device comprising:
a first conductivity semiconductor layer;
an active layer; and
a second conductivity semiconductor layer, wherein the active layer comprises a plurality of quantum well layers and a plurality of barrier layers stacking alternately, and the barrier layers comprise outer barrier layers and inner barrier layers, wherein one of the outer barrier layers is closest to the first conductivity semiconductor layer and another one of the outer barrier layers is closest to the second conductivity semiconductor layer, wherein the inner barrier layers comprise at least one p-type doped barrier layer and a plurality of undoped barrier layers, wherein the two barrier layers closest to the first conductivity semiconductor layer and the second conductivity semiconductor layer are undoped layers.

2. The light emitting device according to claim 1, further comprising:
a substrate disposed under the second conductivity semiconductor layer; and
an electrode disposed on the first conductivity semiconductor layer.

3. The light emitting device according to claim 1, wherein an impurity of the p-type doped barrier layer is selected from a group consisting of Be, Mg, Ba and C.

4. The light emitting device according to claim 3, wherein the impurity is evenly distributed in the p-type doped barrier layer.

5. The light emitting device according to claim 1, wherein materials of the first conductivity semiconductor layer, the active layer, and the second conductivity semiconductor layer comprise at least two elements selected from the group consisting of Al, Ga, In, N, P and As.

6. The light emitting device according to claim 3, wherein the impurity is evenly distributed in a specific region of the p-type doped barrier layer.

7. The light emitting device according to claim 3, wherein the impurity of the p-type doped barrier layer is Delta doped.

8. The light emitting device according to claim 1, wherein the at least one p-type doped barrier layer is disposed closer to the first conductivity semiconductor layer than the second conductivity semiconductor layer.

9. The light emitting device according to claim 1, wherein the at least one p-type doped barrier layers is disposed closer to the second conductivity semiconductor layer than the first conductivity semiconductor layer.

10. The light emitting device according to claim 1, wherein the at least one p-type doped barrier layer is disposed in the middle of the active layer.

11. A light emitting device comprising:
a first conductivity semiconductor layer;
an active layer; and
a second conductivity semiconductor layer, wherein the active layer comprises a plurality of quantum well layers and a plurality of barrier layers stacking alternately, and the barrier layers comprise outer barrier layers and inner barrier layers, wherein one of the outer barrier layers is closest to the first conductivity semiconductor layer and another one of the outer barrier layers is closest to the second conductivity semiconductor layer, wherein the inner barrier layers comprise a plurality of undoped barrier layers and at least one p-type doped barrier layer located between the undoped barrier layers,
wherein the two barrier layers closest to the first conductivity semiconductor layer and the second conductivity semiconductor layer are undoped layers.

* * * * *